(12) United States Patent
Suzuki et al.

(10) Patent No.: US 10,103,041 B2
(45) Date of Patent: Oct. 16, 2018

(54) COMPONENT TRANSFER APPARATUS AND SUCTION POSITION ADJUSTMENT METHOD FOR COMPONENT TRANSFER APPARATUS

(75) Inventors: Yasuhiro Suzuki, Shizuoka (JP); Yasuyoshi Hongashi, Shizuoka (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 668 days.

(21) Appl. No.: 13/535,209

(22) Filed: Jun. 27, 2012

(65) Prior Publication Data
US 2013/0120554 A1   May 16, 2013

(30) Foreign Application Priority Data
Nov. 15, 2011 (JP) .................................. 2011-250001

(51) Int. Cl.
H04N 7/18      (2006.01)
H01L 21/67    (2006.01)
H05K 13/08   (2006.01)

(52) U.S. Cl.
CPC ....... *H01L 21/67132* (2013.01); *H05K 13/08* (2013.01)

(58) Field of Classification Search
CPC .... H01L 21/681; H01L 21/682; G03F 9/7011; H04N 7/18
USPC ............................................ 248/87; 356/400
See application file for complete search history.

(56) References Cited

U.S. PATENT DOCUMENTS

| 6,014,965 | A  | * | 1/2000 | Nishida | ................ | G01R 31/308 |
| | | | | | | 125/12 |
| 6,931,717 | B2 | * | 8/2005 | Mizuno | .............. | H05K 13/0413 |
| | | | | | | 29/714 |
| 2003/0029032 | A1 | * | 2/2003 | Haji | .................. | H01L 21/67144 |
| | | | | | | 29/832 |
| 2004/0148769 | A1 | | 8/2004 | Haji et al. | | |
| 2005/0076497 | A1 | | 4/2005 | Mizuno et al. | | |

(Continued)

FOREIGN PATENT DOCUMENTS

JP    2004-103923 A    4/2004
KR  10-2004-0030915 A  4/2004

OTHER PUBLICATIONS

The Korean Office Action issued by the Korean Intellectual Property Office dated Oct. 4, 2013, which corresponds to Korean Patent Application No. 10-2012-0080019 and is related to U.S. Appl. No. 13/535,209; with partial English translation.

*Primary Examiner* — Deirdre L Beasley
(74) *Attorney, Agent, or Firm* — Studebaker & Brackett PC

(57) ABSTRACT

A component transfer apparatus includes: an upthrust section that thrusts up a wafer component held by a wafer holding table from below; an extraction head that suctions the wafer component thrust up by the upthrust section or an adjustment chip placed on the upthrust section; an imaging section that performs imaging of the wafer component or the adjustment chip being suctioned by the extraction head; and a control section that controls driving of the extraction head and operations of the imaging section. Upon suction position adjustment, the control section causes the imaging section to perform imaging of the wafer component or the adjustment chip being suctioned by the extraction head, and adjusts a suction position of the wafer component by the extraction head based on a result of the imaging.

9 Claims, 9 Drawing Sheets

(56) References Cited

U.S. PATENT DOCUMENTS

| | | | | |
|---|---|---|---|---|
| 2007/0006453 A1* | 1/2007 | Onobori | ............ | H05K 13/0465 |
| | | | | 29/832 |
| 2008/0013089 A1* | 1/2008 | Ishii | ............ | G03F 9/7011 |
| | | | | 356/400 |
| 2010/0083488 A1* | 4/2010 | Kobayashi | ............ | H01L 21/681 |
| | | | | 29/739 |
| 2010/0220183 A1* | 9/2010 | Yoro | ............ | H01L 21/67144 |
| | | | | 348/86 |
| 2010/0257727 A1* | 10/2010 | Hiraki | ............ | H01L 21/67144 |
| | | | | 29/729 |
| 2012/0015458 A1* | 1/2012 | Akamatsu | ............ | H05K 13/021 |
| | | | | 438/15 |

* cited by examiner

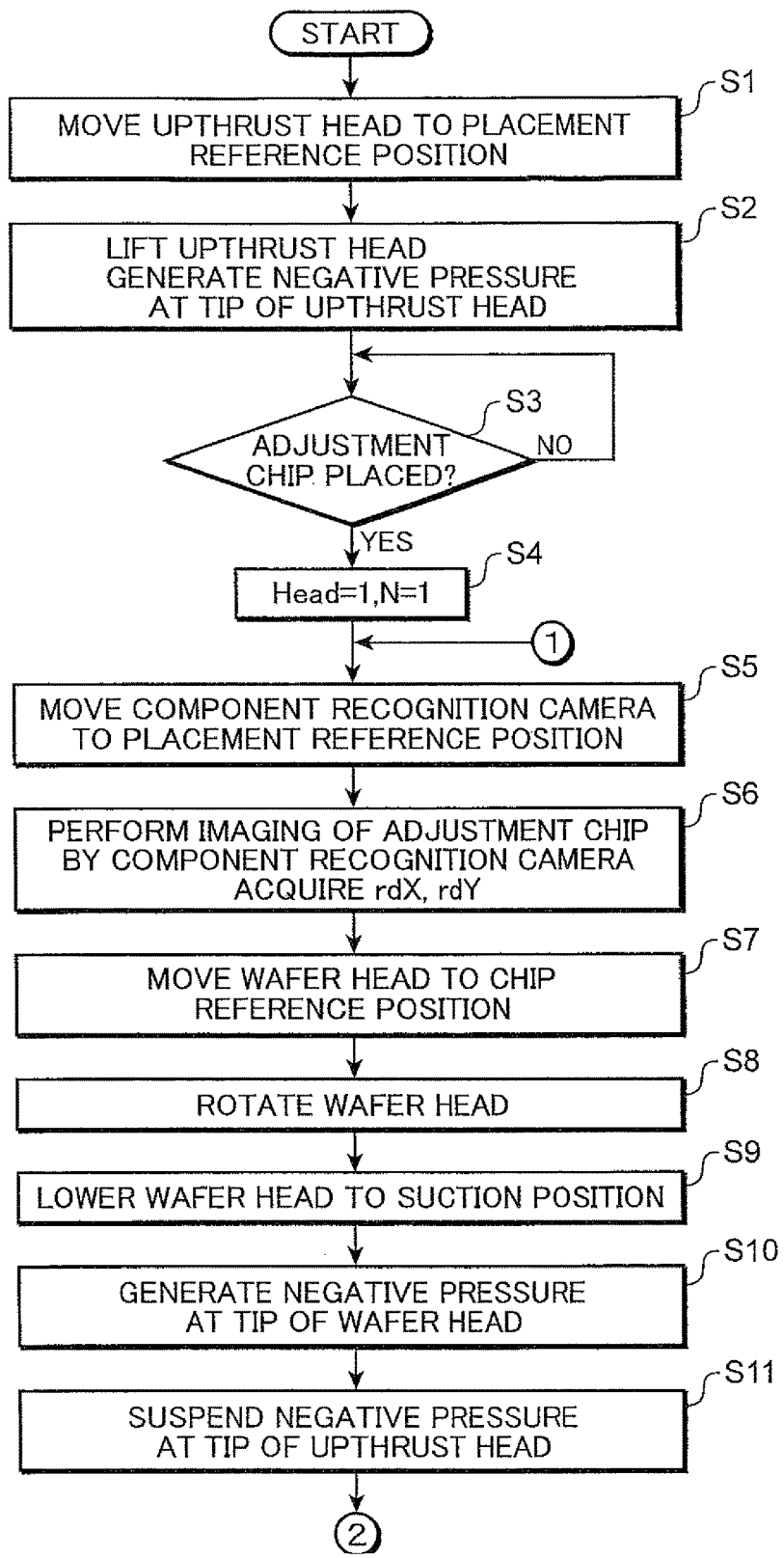

COMPONENT TRANSFER APPARATUS AND SUCTION POSITION ADJUSTMENT METHOD FOR COMPONENT TRANSFER APPARATUS

BACKGROUND OF THE INVENTION

Field of the Invention

The present invention relates to a component transfer apparatus including an extraction head that suctions a wafer component and to a suction position adjustment method for the component transfer apparatus.

Description of the Background Art

Conventionally, component transfer apparatuses including an extraction head that suctions a wafer component are known. For example, Japanese Patent Application Laid-open No. 2004-103923 discloses a mounting apparatus (a component transfer apparatus) including: a component supplying table (a wafer holding table) capable of holding a wafer component; an extraction nozzle (an extraction head) that suctions a wafer component; a pre-alignment camera that performs imaging of a wafer component being suctioned by the extraction nozzle; and a control apparatus (a control section) that controls driving of the extraction nozzle. With this mounting apparatus, imaging of a position of a wafer component is performed by the pre-alignment camera when the wafer component is handed over by the extraction nozzle, and when the wafer component is suctioned by the extraction nozzle in a state in which the center of the extraction nozzle and the center of the wafer component are misaligned relative to each other, a handover position of the wafer component is corrected.

However, with the mounting apparatus described above, since a handover position of the wafer component is corrected by performing imaging of a position of the wafer component with a pre-alignment camera when the wafer component is handed over by the extraction nozzle, a suction position of the wafer component by the extraction head is not accurately adjusted. Therefore, there may be cases in which the wafer component is suctioned by the extraction nozzle (the extraction head) in a state in which the center of the extraction nozzle and the center of the wafer component are misaligned relative to each other. As a result, a positional accuracy of suction of a wafer component by an extraction nozzle is problematically low.

SUMMARY OF THE INVENTION

An object of the present invention is to increase a positional accuracy of suction of a wafer component by an extraction head in a component transfer apparatus.

A component transfer apparatus according to an aspect of the present invention that achieves the object described above includes:

a wafer holding table capable of holding a wafer component;

an upthrust section that thrusts up the wafer component held by the wafer holding table from below;

an extraction head that suctions the wafer component thrust up by the upthrust section or an adjustment chip placed on the upthrust section;

an imaging section that performs imaging of the wafer component or the adjustment chip being suctioned by the extraction head; and a control section that controls driving of the extraction head and operations of the imaging section; wherein upon suction position adjustment, the control section causes the imaging section to perform imaging of the wafer component or the adjustment chip being suctioned by the extraction head, and adjusts a suction position of the wafer component by the extraction head based on a result of the imaging.

In addition, a suction position adjustment method according to another aspect of the present invention is a suction position adjustment method for a component transfer apparatus including an upthrust section, an extraction head, and an imaging section, the suction position adjustment method including:

causing the extraction head to suction the wafer component thrust up by the upthrust section or an adjustment chip placed on the upthrust section;

causing the imaging section to perform imaging of the wafer component or the adjustment chip being suctioned by the extraction head; and adjusting a suction position of the wafer component by the extraction head based on a result of the imaging.

BRIEF DESCRIPTION OF THE DRAWINGS

FIGS. 6A, 6B, and 6C are flow charts for explaining an adjustment operation of a suction position by a control section of the component transfer apparatus.

DESCRIPTION OF THE PREFERRED EMBODIMENTS

Figure 1:
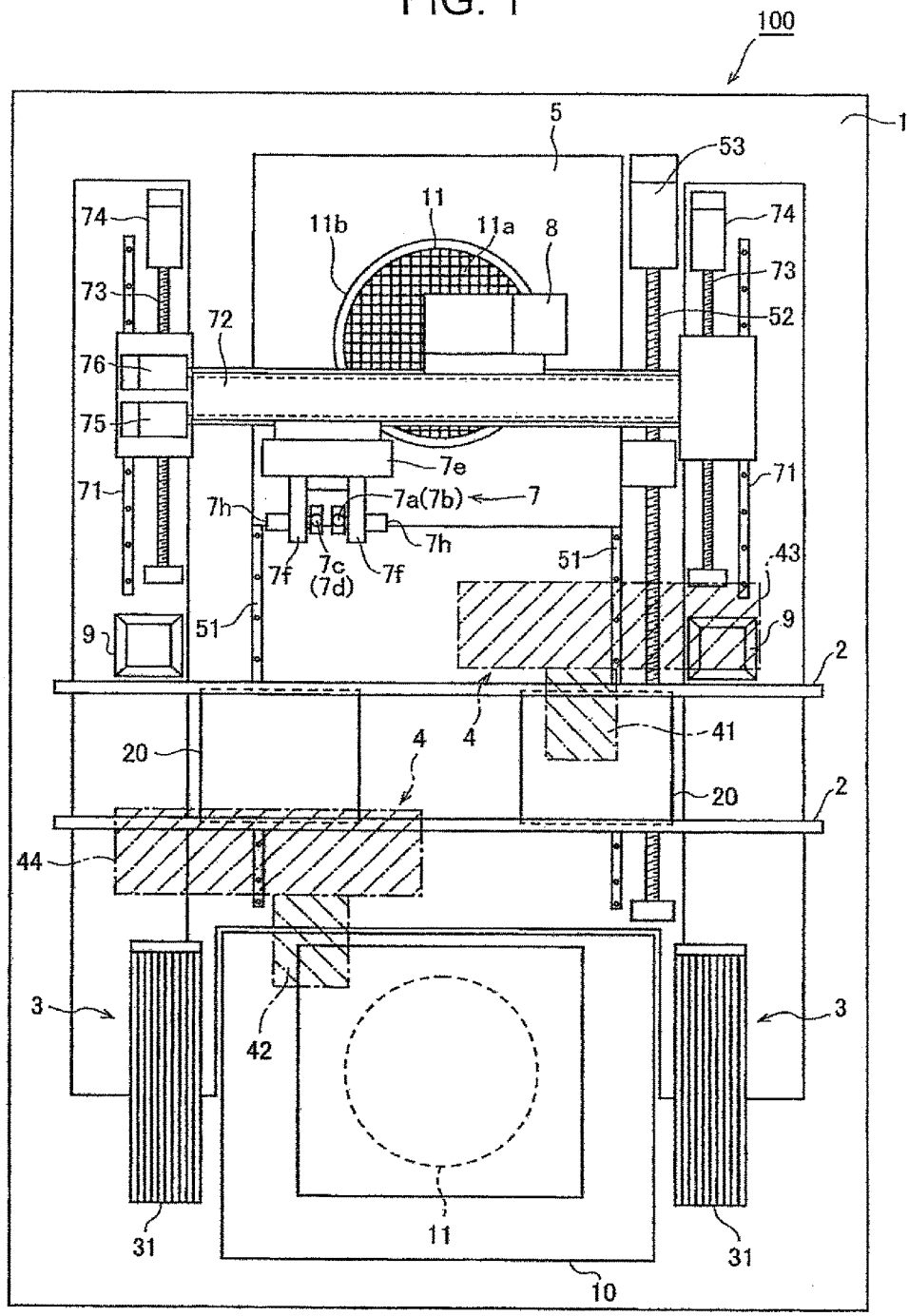
FIG. 1 is a plan view showing an overall construction of a component transfer apparatus according to an embodiment of the present invention.
Figure 1:
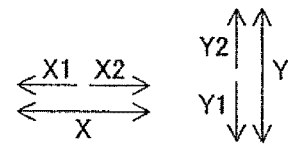

Hereinafter, embodiments of the present invention will be described with reference to the drawings. First, a structure of a component transfer apparatus 100 according to an embodiment of the present invention will be described with reference to FIGS. 1 to 5.

The component transfer apparatus 100 is a so-called complex-type component transfer apparatus capable of extracting a bare chip 11a from a diced wafer 11 and mounting (populating) the bare chip 11a onto a printed wiring board 20, and mounting a chip component or the like supplied from a tape feeder 31 onto the printed wiring board 20. The bare chip 11a is an example of a "wafer component" according to the present invention, and the printed wiring board 20 is an example of a "substrate" according to the present invention.

Figure 5:
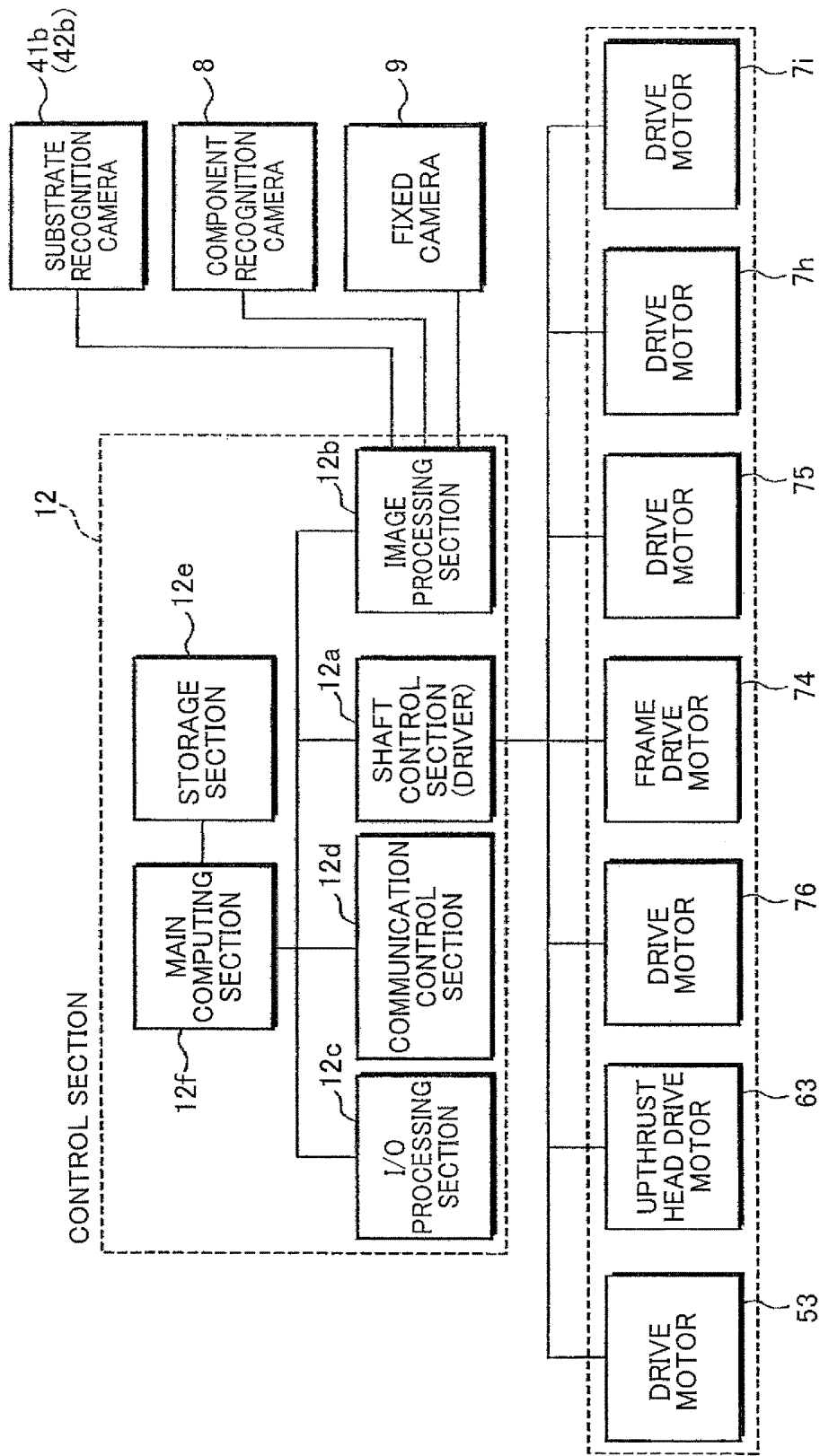
FIG. 5 is a block diagram showing a control system of the component transfer apparatus.

As shown in FIG. 1, the component transfer apparatus 100 includes a base 1, a conveyor 2, two chip component supplying sections 3, a mounting section 4, a wafer holding table 5, an upthrust section 6 (refer to FIG. 2), an extracting section 7, a component recognition camera 8, and a control section 12 (refer to FIG. 5).

The conveyor 2 conveys the printed wiring board 20 to and from a predetermined mounting work position. The conveyor 2 includes a conveyor body that extends in an X-direction in which the printed wiring board 20 is conveyed, and a positioning mechanism (not shown) that lifts and positions the printed wiring board 20 on the conveyor body. The conveyor 2 conveys the printed wiring board 20 in an approximately horizontal posture from an X2-direction side toward an X1-direction side, and positions and fixes the printed wiring board 20 at a predetermined mounting work position. In the present embodiment, two positions (positions of the printed wiring board 20 in FIG. 1) on a conveying path constituted by the conveyor 2 and separated from each other by a predetermined interval in the X-direction are respectively assumed as mounting work positions.

The two chip component supplying sections 3 are respectively provided at both near side (Y1-direction side) ends of the component transfer apparatus 100. The chip component supplying sections 3 are provided for supplying chip components such as a transistor, a resistor, a capacitor, and the like. Tape feeders 31 are arranged side by side along the X-direction in the chip component supplying section 3. Each tape feeder 31 includes a reel around which a tape that holds chip components at predetermined intervals is wound, a holding member that holds the reel, and a component feeding mechanism which feeds out chip components to a component supplying position while drawing out the tape from the reel.

While being attached to the chip component supplying section 3, the tape feeder 31 works together with the component transfer apparatus 100 to perform a feed-out operation of a chip component. Specifically, a chip component is picked up at the component supplying position by the mounting section 4 of the component transfer apparatus 100 and, in accordance with the pick-up, the tape feeder 31 feeds out a next chip component to the component supplying position. Moreover, instead of the tape feeder 31, a tray (not shown) on which a large-size package component such as a semiconductor package is placed may be installed in the chip component supplying section 3. In this case, the package component is directly picked up from the tray by the mounting section 4.

The mounting section 4 mounts the bare chip 11a or a chip component onto the printed wiring board 20. In addition, the mounting section 4 includes two head units (a first head unit 41 and a second head unit 42) respectively movable in a horizontal direction (XY-direction) at upper (Z2-direction) positions of the conveyor 2, and drive means that individually drives the head units.

Figure 2:
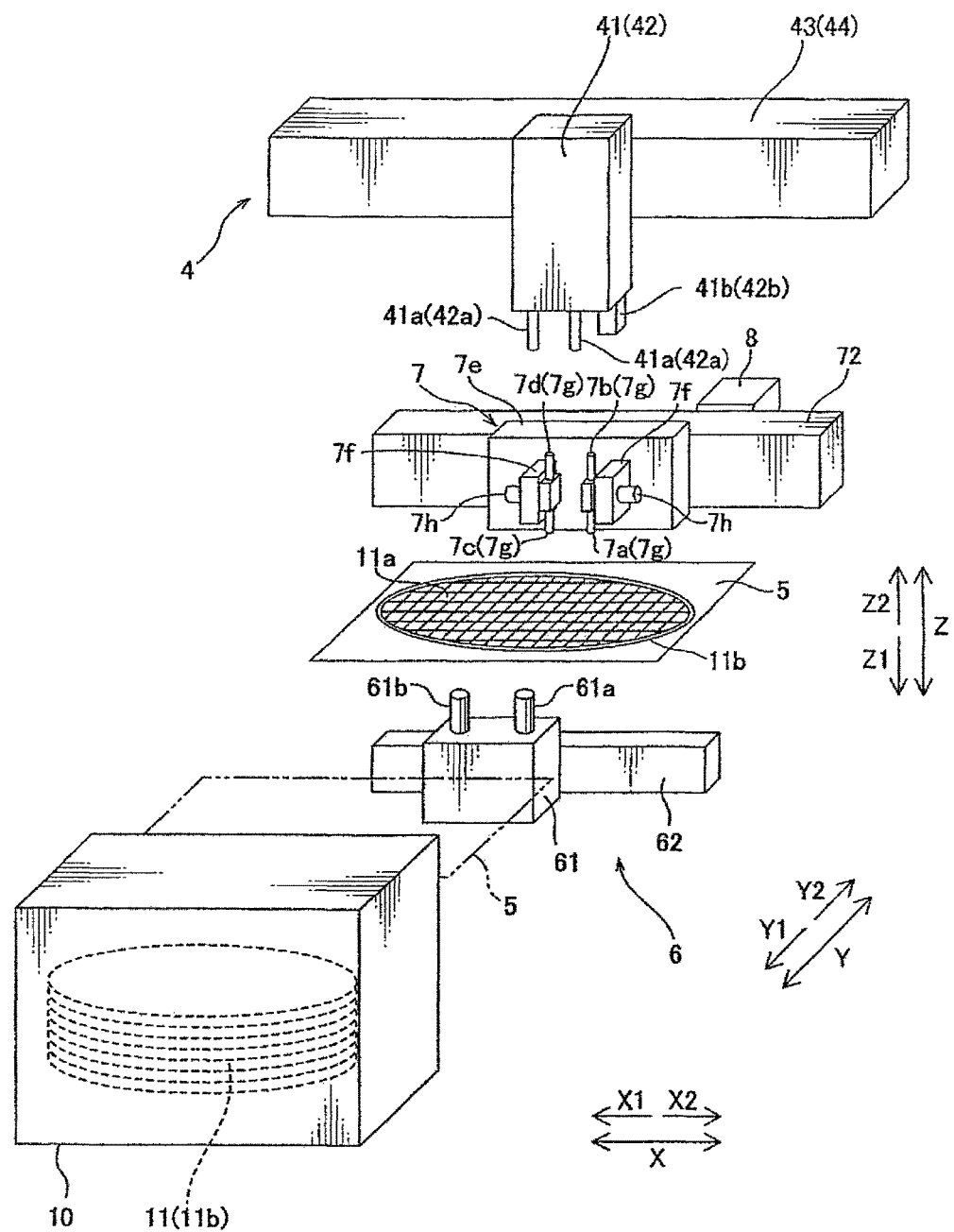
FIG. 2 is an exploded perspective view showing primary constituents of the component transfer apparatus.

A movable region of the first head unit 41 is primarily constituted by an upstream side (X2-direction side) region on the base 1 and the first head unit 41 is only movable within this region. On the other hand, a movable region of the second head unit 42 is primarily constituted by a downstream side (X1-direction side) region on the base 1 and the second head unit 42 is only movable within this region. As shown in FIG. 2, the first head unit 41 (the second head unit 42) includes two component mounting heads 41a (two component mounting heads 42a) arranged along the X-direction, and one substrate recognition camera 41b (one substrate recognition camera 42b). The substrate recognition cameras 41b and 42b are examples of an "imaging section" according to the present invention.

The first head unit 41 (the second head unit 42) suctions a chip component supplied by the tape feeder 31 using the component mounting heads 41a (42a) and mounts the chip component onto the printed wiring board 20. In addition, the first head unit 41 (the second head unit 42) suctions the bare chip 11a extracted from the wafer 11 by the extracting section 7 using the component mounting heads 41a (42a) and mounts the bare chip 11a onto the printed wiring board 20. Accordingly, both a chip component such as a transistor or a capacitor and the bare chip 11a are mounted onto the printed wiring board 20. Due to negative pressure generated at a tip of the component mounting heads 41a (42a) by a negative pressure generator (not shown), the component mounting heads 41a (42a) are capable of suctioning and holding a chip component supplied from the tape feeder 31 or the bare chip 11a supplied from the extracting section 7.

The substrate recognition camera 41b (42b) is a camera including an imaging element such as a CCD or a CMOS. With the first head unit 41 (the second head unit 42), before a component is mounted onto the printed wiring board 20, a misregistration of the printed wiring board 20 is recognized due to a recognition by the substrate recognition camera 41b (42b) of a fiducial mark (not shown) affixed to the printed wiring board 20, and the misregistration is corrected upon mounting.

In the present embodiment, upon suction position adjustment, the substrate recognition camera 41b (42b) performs imaging of an adjustment chip 11c (refer to FIG. 7) suctioned by the extracting section 7. In addition, upon component mounting, the substrate recognition camera 41b (42b) performs imaging of a fiducial mark (not shown) affixed to the printed wiring board 20.

The first head unit 41 (the second head unit 42) includes a supporting member 43 (44), a fixed rail (not shown), and a moving mechanism (not shown). The supporting member 43 (44) supports the first head unit 41 (the second head unit 42) so as to be movable in the X-direction. The fixed rail supports the supporting member 43 (44) so as to be movable in the Y-direction. The moving mechanism includes a linear motor (not shown) for moving the first head unit 41 (the second head unit 42) in the X-direction relative to the supporting member 43 (44), and a linear motor (not shown) for moving the supporting member 43 (44) in the Y-direction along the fixed rail.

A fixed camera 9 for component recognition is installed on the base 1 in the respective movable regions of the first head unit 41 and the second head unit 42. The fixed camera 9 performs imaging of components suctioned by the component mounting head 41a of the first head unit 41 and the component mounting head 42a of the second head unit 42 from below (Z1-direction side), and outputs an image signal thereof to the control section 12.

As shown in FIG. 1, a wafer housing section 10 which houses the wafer 11 is detachably fixed to a central part on a near side (Y1-direction side) of the component transfer apparatus 100. As shown in FIG. 2, the wafer housing section 10 houses a plurality of diced wafers 11. The wafer housing section 10 includes a rack that houses an approximately annular holder 11b holding the wafer 11 in a plurality of upper and lower levels, and drive means that drives lifting and lowering of the rack. Due to the lifting and lowering of the rack, the wafer housing section 10 arranges a desired wafer 11 at a predetermined feed-in/feed-out height that enables the wafer to be fed out to and fed in from the wafer holding table 5.

Each wafer 11 housed in the wafer housing section 10 is pasted on a film-like wafer sheet so that each bare chip 11a faces upward (a state in which a circuit forming surface (a mounting surface with respect to the printed wiring board 20) faces upward), and is held by the holder 11b via the wafer sheet.

The wafer holding table 5 supports the wafer 11 drawn out from the wafer housing section 10. The component transfer apparatus 100 includes a feed-in/feed-out mechanism (not shown) that feeds out the wafer 11 to and feeds the wafer 11 in from the wafer holding table 5. The feed-in/feed-out mechanism is an arm constructed so as to be movable forward and backward (Y-direction) with respect to the wafer holding table 5, and includes a holder grasping mechanism at a tip of the feed-in/feed-out mechanism. In a state in which the wafer holding table 5 is arranged at a wafer accepting position, the feed-in/feed-out mechanism is capable of drawing out the wafer 11 (the holder 11b) arranged at a feed-in/feed-out height from the wafer housing section 10 onto the wafer holding table 5, and housing (returning) the wafer 11 (the holder 11b) on the wafer holding table 5 into the rack.

The wafer holding table 5 has a circular central opening, and holds the holder 11b so that an opening of the holder 11b holding the wafer 11 and the opening of the wafer holding table 5 overlap each other. Accordingly, in a state in which the wafer 11 (the holder 11b) is held by the wafer holding table 5, the bare chip 11a can be thrust up by the upthrust section 6 from below (Z1-direction) the wafer holding table 5.

The wafer holding table 5 is capable of moving the base 1 in the Y-direction between a component extraction work position and the wafer accepting position. More specifically, the wafer holding table 5 is movably supported by a pair of fixed rails 51 (refer to FIG. 1) provided so as to extend in the Y-direction on the base 1, and is moved along the fixed rails 51 by predetermined drive means. The drive means includes a ball screw shaft 52 which extends parallel to the fixed rails 51 and which is screwed and inserted into a nut portion of the wafer holding table 5, and a drive motor 53 for rotationally driving the ball screw shaft 52. In addition, the wafer holding table 5 passes a position below the conveyor 2 and moves between a predetermined component extraction work position and a wafer accepting position in a vicinity of the wafer housing section 10.

The upthrust section 6 thrusts up, from below, an extraction object bare chip 11a among a group of bare chips of the wafer 11 on the wafer holding table 5 arranged at the component extraction work position in order to separate and lift the bare chip 11a from the wafer sheet.

As shown in FIG. 2, the upthrust section 6 includes an upthrust head 61, a fixed rail 62, and drive means (not shown). The upthrust head 61 includes a pair of small-diameter upthrust rods (a first upthrust rod 61a and a second upthrust rod 61b). Each upthrust rod has a built-in upthrust pin (not shown). In addition, due to negative pressure generated at a tip of the upthrust head 61 (the first upthrust rod 61a and the second upthrust rod 61b) by a negative pressure generator (not shown), the upthrust head 61 suctions the bare chip 11a of the wafer 11 or the adjustment chip 11c. Accordingly, a misregistration of the bare chip 11a or the adjustment chip 11c during upthrust is suppressed.

The fixed rail 62 is fixed on the base 1. In addition, the fixed rail 62 supports the upthrust head 61 so as to be movable in the X-direction. The drive means moves the upthrust head 61 along the fixed rail 62. More specifically, the drive means includes a ball screw shaft (not shown) which extends in the X-direction and which is screwed and inserted into the upthrust head 61, and an upthrust head drive motor 63 (refer to FIG. 5) for rotationally driving the ball screw shaft. By constructing the upthrust head 61 so as to be movable in the X-direction, the upthrust head 61 is capable of thrusting up any bare chip 11a with respect to the wafer 11 supported on the wafer holding table 5 that is only movable in the Y-direction.

The first upthrust rod 61a and the second upthrust rod 61b of the upthrust head 61 extend upward and downward (Z-direction) and are respectively driven so as to be lifted and lowered by an actuator (an air cylinder or the like; not shown). In other words, in a state in which the first upthrust rod 61a or the second upthrust rod 61b is arranged inside the opening of the wafer holding table 5, the first upthrust rod 61a or the second upthrust rod 61b is driven to be lifted to a position at which the first upthrust rod 61a or the second upthrust rod 61b almost comes into contact with a lower side of the wafer sheet. Subsequently, the first upthrust rod 61a or the second upthrust rod 61b is arranged at the XY-direction position of a desired bare chip 11a, and the upthrust pin is driven to be lifted from the first upthrust rod 61a or the second upthrust rod 61b by a drive motor (not shown) in order to thrust up the bare chip 11a.

Moreover, with the first upthrust rod 61a and the second upthrust rod 61b, a diameter of the upthrust pin or the like can be altered in accordance with a size of a component that is an upthrust object. For example, by respectively fitting different upthrust pins to the first upthrust rod 61a and the second upthrust rod 61b, the first upthrust rod 61a or the second upthrust rod 61b can be used separately depending on the size of a component or the like.

The first upthrust rod 61a and the second upthrust rod 61b can be driven so as to be lifted or lowered to heights corresponding to two levels. More specifically, when moving the wafer holding table 5 between the component extraction work position and the wafer accepting position in the vicinity of the wafer housing section 10, the first upthrust rod 61a and the second upthrust rod 61b are lifted and lowered between a lowermost position for avoiding interference with the wafer holding table 5 and an upthrust stand-by position inside the opening of the holder 11b in a vicinity of a lower surface of the wafer 11 when the wafer holding table 5 is at the component extraction work position. The upthrust pin can be driven so as to be lifted and lowered between a position at which the upthrust pin is inserted in the first upthrust rod 61a or the second upthrust rod 61b at a stand-by position and a component upthrust position that is higher (Z2-direction) than an upper surface of the wafer holding table 5.

The extracting section 7 suctions the bare chip 11a thrust up by the upthrust section 6 and hands the bare chip 11a over to the first head unit 41 and the second head unit 42. The extracting section 7 is moved in a horizontal direction (XY-direction) at a position above (Z2-direction) the component extraction work position by predetermined drive means. In addition, as shown in FIG. 2, the extracting section 7 includes four wafer heads 7a to 7d, a frame member 7e, two bracket members 7f, four nozzles 7g, two drive motors 7h, and a drive motor 7i (refer to FIG. 5). The wafer heads 7a to 7d are examples of an "extraction head" according to the present invention.

The wafer heads 7a to 7d are drum-type heads. Specifically, the wafer heads 7a to 7d are rotatable around the X axis and movable upward and downward (Z-direction) (capable of rising and falling). The wafer heads 7a to 7d suction the bare chip 11a or the adjustment chip 11c due to negative pressure generated at a tip of the wafer heads 7a to 7d by a negative pressure generator (not shown). The wafer heads 7a to 7d hand over the bare chip 11a to the component mounting head 41a (42a) at a predetermined handover position. The wafer heads 7a and 7b are rotatably supported around the X axis by the right side (X2-direction side) bracket member 7f. In addition, the wafer heads 7c and 7d are rotatably supported around the X axis by the left side (X1-direction side) bracket member 7f. The nozzles 7g for component suction are respectively fitted to the tips of the wafer heads 7a to 7d. The bracket members 7f are respectively supported by the frame member 7e so as to be capable of rising and falling.

The wafer heads 7a and 7b and the wafer heads 7c and 7d are respectively arranged adjacent to and opposing each other. In addition, the wafer head 7a (7c) and the wafer head 7b (7d) are arranged on opposite sides to each other. In other words, the wafer head 7a (7c) and the wafer head 7b (7d) are arranged so that when one faces directly downward (Z1-direction), the other faces directly upward (Z2-direction). Furthermore, vertical (Z-direction) positions of the wafer head 7a (7c) and the wafer head 7b (7d) are interchanged by rotational driving of the drive motors 7h respectively provided on an outer side of the bracket member 7f.

Figure 4:
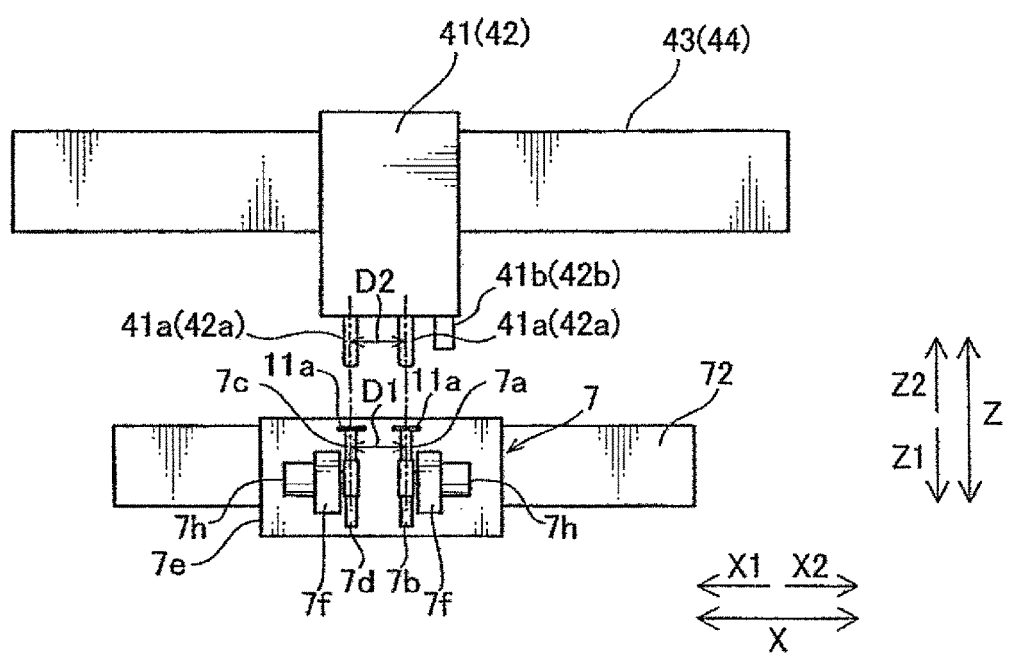
FIG. 4 is a front view showing a handover state of a wafer component of the component transfer apparatus.

The wafer heads 7a to 7d rise and fall as a result of the bracket member 7f being lifted and lowered with respect to the frame member 7e due to driving of the drive motor 7i (refer to FIG. 5). In addition, as shown in FIG. 4, an interval D1 (an interval in the X-direction) between the wafer heads 7a and 7b and the wafer heads 7c and 7d is approximately equal to an interval D2 between the component mounting heads 41a of the first head unit 41 (the component mounting heads 42a of the second head unit 42). Consequently, two bare chips 11a can be simultaneously handed over from the wafer head 7a or 7b and the wafer head 7c or 7d to the two component mounting heads 41a of the first head unit 41 or the two component mounting heads 42a of the second head unit 42.

As shown in FIG. 1, the drive means of the extracting section 7 includes a pair of fixed rails 71, a frame member 72, a pair of ball screw shafts 73, and a pair of frame drive motors 74. The pair of fixed rails 71 is fixed on the base 1. In addition, the pair of fixed rails 71 is arranged so as to extend in the Y-direction such that the pair of fixed rails 71 are parallel to each other and are separated from each other by a predetermined interval in the X-direction. The frame member 72 is arranged so as to extend in the X-direction with both ends of the frame member 72 movably supported on the fixed rails 71. The pair of ball screw shafts 73 are arranged at a position in proximity to the fixed rails 71 so as to extend in the Y-direction. In addition, each of the pair of ball screw shafts 73 is screwed and inserted into a nut member (not shown) at one of the ends of the frame member 72. The pair of frame drive motors 74 rotationally drives the ball screw shafts 73. Due to actuation of the pair of the frame drive motors 74, the frame member 72 moves along the fixed rails 71, and the extracting section 7 and the component recognition camera 8 integrally move in the Y-direction accompanying the movement of the frame member 72.

The frame member 72 is provided with a first rail (not shown) which is fixed to a near side (Y1-direction side) and which extends in the X-direction and a second rail (not shown) which is fixed to a rear side (Y2-direction side) and which extends in the X-direction. The first rail supports the extracting section 7 so as to be movable in the X-direction. The second rail supports the component recognition camera 8 so as to be movable in the X-direction. The frame member 72 is provided with a ball screw shaft (not shown) which extends in the X-direction and which is screwed and inserted into a nut member (not shown) of the extracting section 7 and a drive motor 75 (refer to FIG. 1) that rotationally drives the ball screw shaft. In addition, the frame member 72 is provided with a ball screw shaft (not shown) which extends in the X-direction and which is screwed and inserted into a nut member (not shown) of the component recognition camera 8 and a drive motor 76 (refer to FIG. 1) that rotationally drives the ball screw shaft. Accordingly, due to an actuation of the drive motor 75, the extracting section 7 is movable in the X-direction at a near side (Y1-direction side) of the frame member 72. In addition, due to an actuation of the drive motor 76, the component recognition camera 8 is movable in the X-direction at a rear side (Y2-direction side) position of the frame member 72. As a result, the extracting section 7 and the component recognition camera 8 are movable in a horizontal direction (XY-direction) at a position above (Z2-direction) the component extraction work position.

Figure 3:
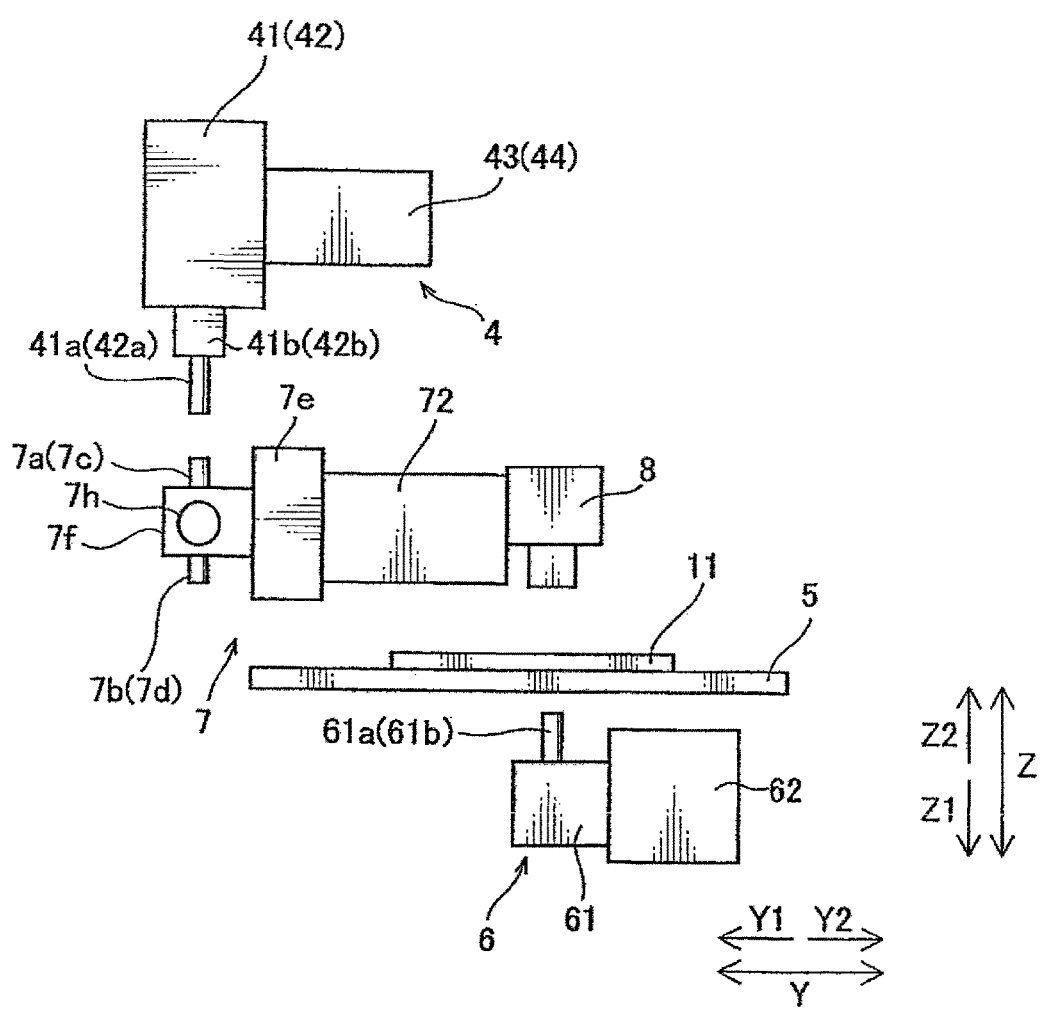
FIG. 3 is a side view showing a handover state of a wafer component of the component transfer apparatus.

A movable region of the extracting section 7 in the XY-direction and a movable region of the first head unit 41 and the second head unit 42 in the XY-direction partially overlap each other in a plan view. Consequently, a handover of the bare chip 11a from the extracting section 7 to the first head unit 41 and the second head unit 42 can be performed. Moreover, as shown in FIG. 3, the extracting section 7, the component recognition camera 8, and the drive means of the extracting section 7 are positioned lower than the first head unit 41 (the second head unit 42) and the drive means thereof. Consequently, although the movable region of the extracting section 7 and the like and the respective movable regions of the first head unit 41 and the second head unit 42 partially overlap each other in a plan view, the extracting section 7 and the first head unit 41 and the second head unit 42 do not interfere with each other.

The component recognition camera 8 is a camera including an imaging element such as a CCD or a CMOS. Before the bare chip 11a is extracted from the wafer 11, the component recognition camera 8 performs imaging of the bare chip 11a that is an extraction object and outputs an image signal thereof to the control section 12. In addition, upon suction position adjustment, the component recognition camera 8 performs imaging of the adjustment chip 11c (refer to FIG. 7) placed on the first upthrust rod 61a (the second upthrust rod 61b) of the upthrust section 6, and outputs an image signal thereof to the control section 12.

As shown in FIG. 5, the drive motor 53, the upthrust head drive motor 63, the frame drive motor 74, the drive motor 75, the drive motor 76, the drive motor 7h, the drive motor 7i, the component recognition camera 8, the fixed camera 9, and the substrate recognition camera 41b (42b) are respectively electrically connected to the control section 12. Operations of the respective sections of the component transfer apparatus 100 are integrally controlled by the control section 12. In addition, an input device (not shown) is electrically connected to the control section 12. Various types of information are inputted by a user by operating the input device. Furthermore, an output signal from position detection means such as an encoder (not shown) built into each drive motor and the like is inputted to the control section 12.

The control section 12 includes a shaft control section 12a, an image processing section 12b, an I/O processing section 12c, a communication control section 12d, a storage section 12e, and a main computing section 12f. The shaft control section 12a controls driving by each drive motor and a drive solenoid of each control valve. The image processing section 12b applies a predetermined process on image signals from the respective cameras (the component recognition camera 8, the fixed camera 9, the substrate recognition camera 41b, and the substrate recognition camera 42b). The I/O processing section 12c controls input of signals from sensors (not shown), output of various control signals, and the like. The communication control section 12d controls communication with external devices. The storage section 12e stores various programs such as a mounting program and various types of data. In addition, the storage section 12e stores a result of adjustment of a suction position of the bare chip 11a by the extracting section 7 (the wafer heads 7a to 7d). The main computing section 12f integrally controls the control section 12 and executes various computing processes.

By controlling the respective drive motors and the like according to a predetermined program, the control section 12 controls operations of the conveyor 2, the wafer holding table 5, the upthrust section 6, the extracting section 7, the first head unit 41, and the second head unit 42. Consequently, an adjustment of a suction position of the bare chip 11a by the extracting section 7 (the wafer heads 7a to 7d) is performed. In addition, a series of operations (component mounting operation) including feeding out the wafer 11 from and feeding the wafer 11 into the wafer housing section 10, extraction of the bare chip 11a from the wafer 11, and mounting of components by the first head unit 41 and the second head unit 42 is controlled by the control section 12. Furthermore, based on a result of suction position adjustment stored in the storage section 12e, the control section 12 also controls suction of the bare chip 11a by the extracting section 7 (the wafer heads 7a to 7d).

Next, control of suction position adjustment by the control section 12 of the component transfer apparatus 100 will be described with reference to FIGS. 6A to 6C and 7. Suction position adjustment is performed in order to adjust a suction position in advance so that the extracting section 7 (the wafer heads 7a to 7d) suctions the bare chip 11a at the center thereof. The suction position adjustment is performed during production, upon installation, and during maintenance after installation of the component transfer apparatus 100. In addition, the suction position adjustment is performed in advance using the adjustment chip 11c before substrate production is started. In this case, the adjustment chip 11c is a chip for calibration prepared for suction position adjustment.

Note that, prior to suction position adjustment, the control section 12 has completed an adjustment for determining relative positions of the substrate recognition camera 41b (42b) and the component mounting head 41a (42a). In addition, the control section 12 has completed an adjustment for determining relative positions of the wafer heads 7a to 7d and the component mounting head 41a (42a) at the component handover position. In the present embodiment, suction position adjustment is performed in a state in which nozzles 7g that are used to suction the bare chip 11a during substrate production are fitted to the wafer heads 7a to 7d.

With reference to FIG. 6A, when an operation to start suction position adjustment is performed by a user, in step S1, the control section 12 causes to move the upthrust head 61 to a placement reference position. Specifically, by driving the upthrust head drive motor 63, the control section 12 moves the upthrust head 61 in the X-direction with respect to the fixed rail 62. Moreover, the placement reference position is set to a center position of the movement of the upthrust head 61 in the X-direction.

In step S2, the control section 12 causes to lift the upthrust head 61 (the upthrust rod 61a). In addition, the control section 12 causes a negative pressure to be generated on a tip of the upthrust head 61 (the upthrust rod 61a). In step S3, the control section 12 judges whether or not the adjustment chip 11c has been placed on the upthrust head 61 (the upthrust rod 61a) by the user. The control section 12 repeats step S3 until the adjustment chip 11c is placed.

Once the adjustment chip 11c is placed (refer to FIG. 7), in step S4, the control section 12 sets Head=1 in order to perform suction position adjustment of the wafer head 7a and sets N=1 in order to perform a first imaging session (measurement). Specifically, Head signifies the number of the four wafer heads and N signifies the number of measurements of each wafer head. Numbers Head=1 to 4 are respectively set for the wafer heads 7a to 7d.

In step S5, the control section 12 cause to move the component recognition camera 8 to the placement reference position. Specifically, by driving the frame drive motor 74, the control section 12 moves the frame member 72 in order to move the component recognition camera 8 in the Y-direction. In addition, by driving the drive motor 76, the control section 12 moves the component recognition camera 8 in the X-direction with respect to the frame member 72. Next, in step S6, the control section 12 uses the component recognition camera 8 to perform imaging of the adjustment chip 11c placed on the upthrust head 61 (the upthrust rod 61a), and based on a result of the imaging, acquires an X-direction deviation rdX and a Y-direction deviation rdY of the adjustment chip 11c from the placement reference position.

In step S7, the control section 12 causes to move the wafer head 7a to a chip reference position that takes into consideration rdX and rdY acquired from the placement reference position and a head offset reference position. Specifically, by driving the frame drive motor 74, the control section 12 moves the frame member 72 in order to move the wafer head 7a in the Y-direction. In addition, by driving the drive motor 75, the control section 12 moves the wafer head 7a in the X-direction with respect to the frame member 72. In this case, the head offset reference position is a position which is set for the wafer head 7a and which becomes a reference for head offset positions of the other three wafer heads 7b to 7d. Furthermore, an initial value of the head offset reference position is set to X=0, Y=0, and Z=0. Moreover, head offset positions (X, Y, and Z) respectively corresponding to the wafer heads 7b to 7d and using the head offset reference position as a reference are set as initial values for the wafer heads 7b to 7d.

In step S8, the control section 12 causes to rotate the wafer head 7a so that the tip of the wafer head 7a faces downward (Z1-direction). Specifically, by driving the drive motor 7h, the control section 12 rotates the wafer head 7a with respect to the bracket member 7f. In step S9, the control section 12 causes to lower the wafer head 7a to a suction position. Specifically, by driving the drive motor 7i, the control section 12 lowers the bracket member 7f with respect to the frame member 7e in order to lower the wafer head 7a. In doing so, the control section 12 lowers the wafer head 7a while taking into account the head offset reference position and a thickness (a length in the Z-direction) of the adjustment chip 11c.

Figure 6B:
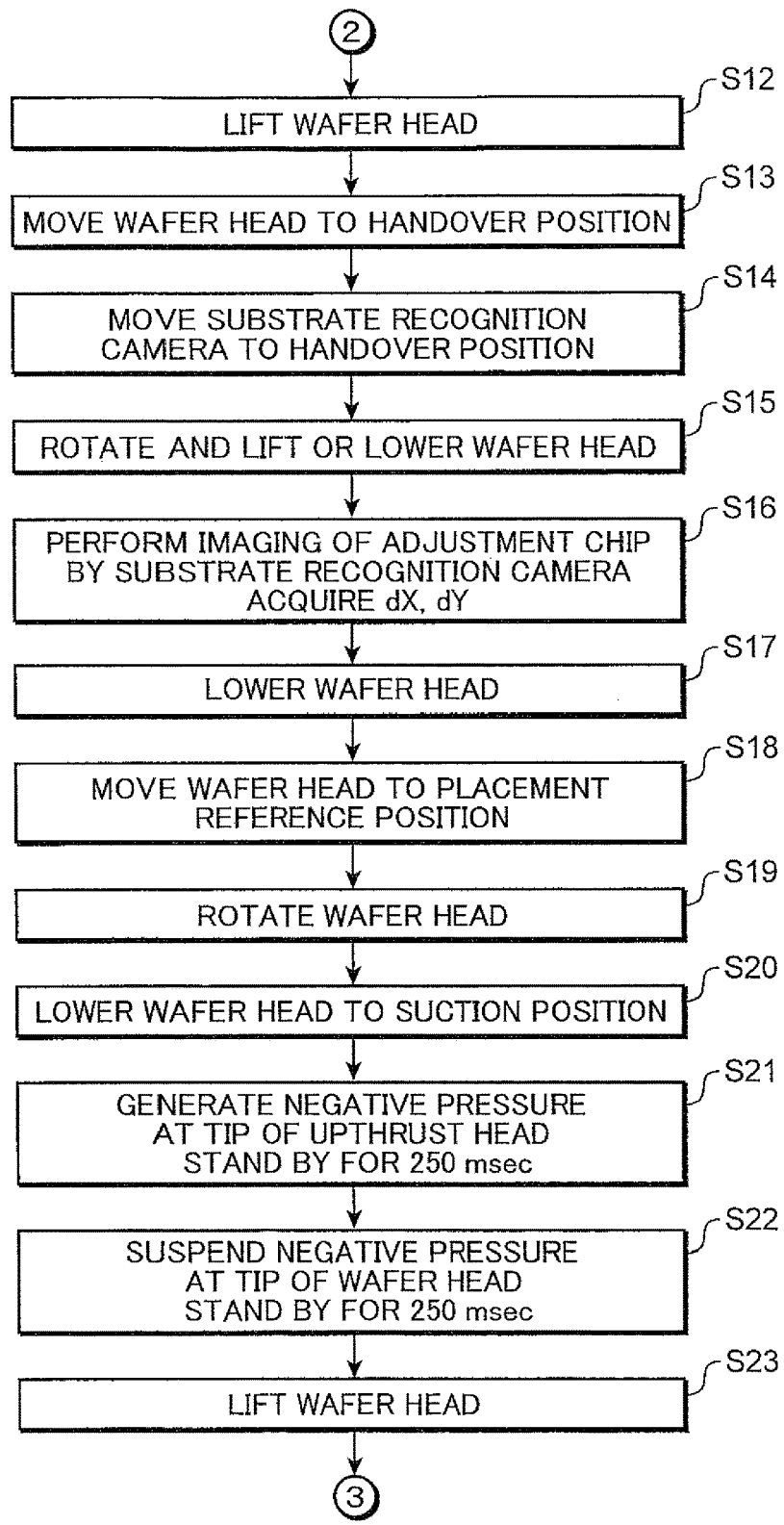

In step S10, the control section 12 causes a negative pressure to be generated on the tip of the wafer head 7a (the nozzle 7g). Consequently, the adjustment chip 11c is suctioned by the wafer head 7a (the nozzle 7g). In step S11, the control section 12 causes the negative pressure at the tip of the upthrust head 61 (the upthrust rod 61a) to be suspended. Referring now to FIG. 6B, in step S12, the control section 12 drives the drive motor 7i in order to lift the wafer head 7a.

In step S13, the control section 12 drives the frame drive motor 74 and the drive motor 75 in order to move the wafer head 7a to a handover position. The handover position is a position at which the wafer head 7a hands over the bare chip 11a to the component mounting head 41a (42a). In step S14, the control section 12 drives the frame drive motor 74 and the drive motor 76 in order to move the substrate recognition camera 41b to the handover position.

In step S15, the control section 12 drives the drive motor 7h in order to rotate the wafer head 7a, and drives the drive motor 7i in order to lift or lower the wafer head 7a to the handover position. In doing so, the control section 12 causes to rotate and lift or lower the wafer head 7a while taking into account the head offset reference position and the thickness (the length in the Z-direction) of the adjustment chip 11c.

At this point, in the present embodiment, in step S16, the control section 12 causes the substrate recognition camera 41b to perform imaging of the adjustment chip 11c suctioned by the wafer head 7a and, based on a result of the imaging, acquires an X-direction deviation dX and a Y-direction deviation dY between the center of the wafer head 7a and the center of the adjustment chip 11c.

In step S17, the control section 12 drives the drive motor 7i in order to lower the wafer head 7a. In step S18, the control section 12 drives the frame drive motor 74 and the drive motor 75 while taking into account the head offset reference position in order to move the wafer head 7a to the placement reference position. In step S19, the control section 12 drives the drive motor 7h while taking into account the head offset reference position in order to rotate the wafer head 7a.

Figure 7:
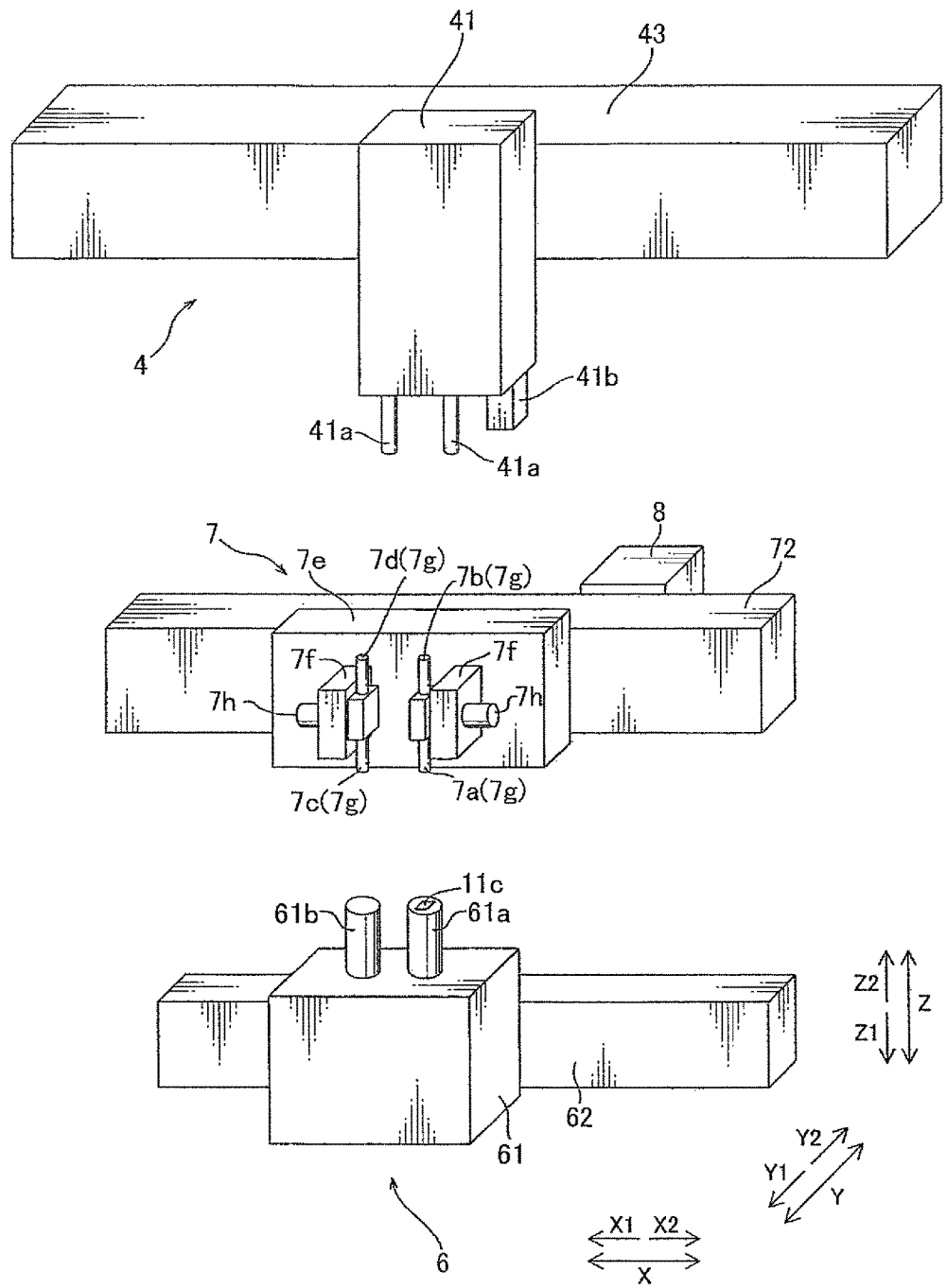
FIG. 7 is a perspective view for explaining an adjustment operation of a suction position of the component transfer apparatus.

In step S20, the control section 12 drives the drive motor 7i while taking into account the head offset reference position and the thickness (the length in the Z-direction) of the adjustment chip 11c in order to lower the wafer head 7a to the suction position. In step S21, the control section 12 causes a negative pressure to be generated at the tip of the upthrust head 61 (the upthrust rod 61a). Consequently, as shown in FIG. 7, the adjustment chip 11c is suctioned by the upthrust head 61 (the upthrust rod 61a). In addition, after issuing a command to generate the negative pressure, the control section 12 stands by for 250 msec in consideration of a time lag of negative pressure generation. Subsequently, in step S22, the control section 12 causes the negative pressure on the tip of the wafer head 7a (the nozzle 7g) to be suspended. In addition, after issuing a command to suspend the negative pressure, the control section 12 stands by for 250 msec in consideration of a time lag of negative pressure suspension.

Subsequently, in step S23, the control section 12 drives the drive motor 7i in order to lift the wafer head 7a. Accordingly, the first imaging session (measurement) for suction position adjustment is completed for one wafer head.

Figure 6C:
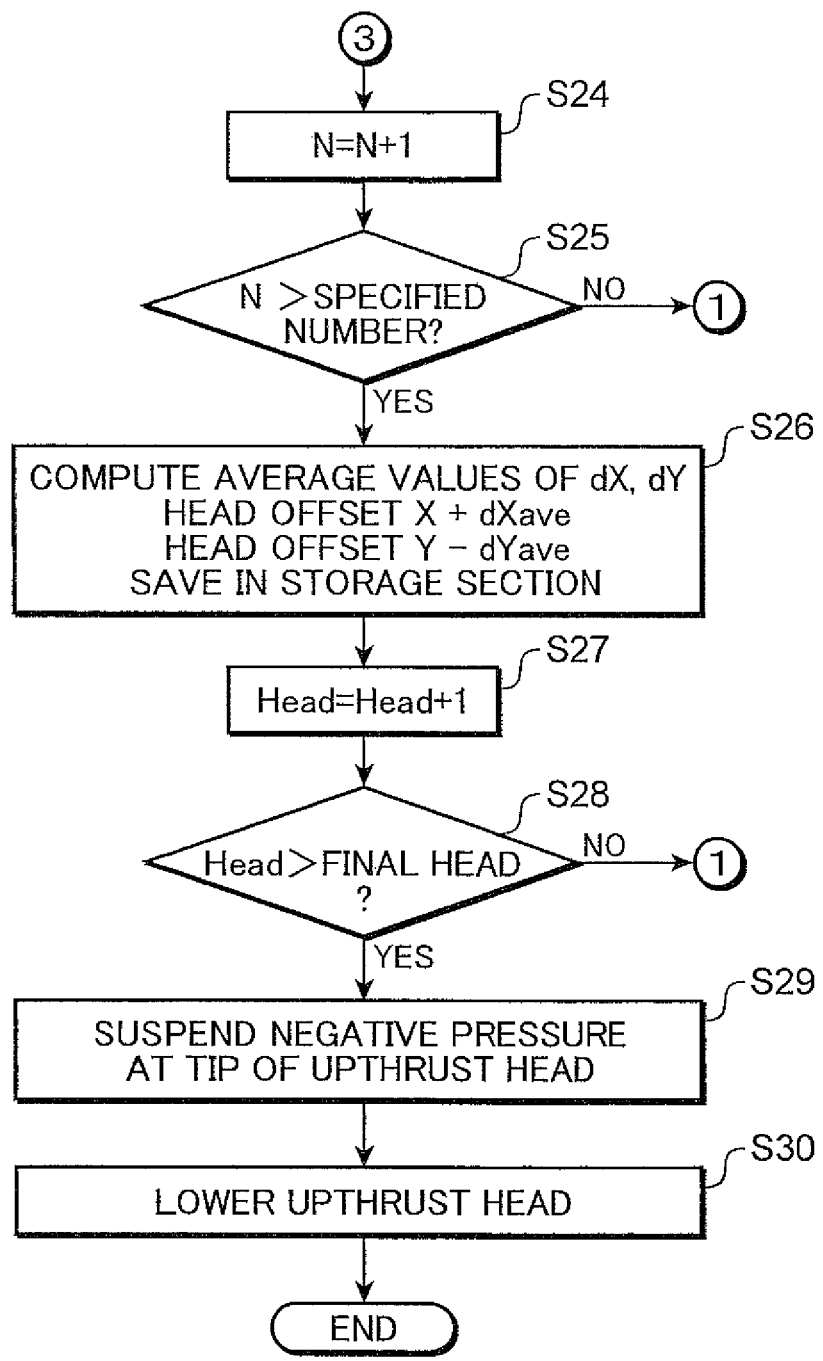

Referring now to FIG. 6C, in step S24, the control section 12 sets N=N+1 in order to perform a second imaging session (measurement). In step S25, the control section 12 judges whether or not N is greater than a specified number. In other words, the control section 12 judges whether or not a specified number of imaging sessions (measurements) has been performed on one wafer head. Specifically, for example, if five imaging sessions (measurements) are to be performed on one wafer head, the control section 12 judges whether or not N is greater than 5. If N is equal to or smaller than 5, the processing is returned to step S5. If N is equal to or greater than 6, the processing is proceeded to step S26.

In the present embodiment, in step S26, the control section 12 computes average values dXave and dYave of dX and dY acquired for the specified number of times (for example, five) based on results of imaging of the adjustment chip 11c performed by the substrate recognition camera 41b. In addition, the control section 12 respectively updates (sets) initial values of X and Y of the head offset reference position to X=X+dXave and Y=Y−dYave, and saves the updated values in the storage section 12e as a result of suction position adjustment. Accordingly, suction position adjustment is completed with respect to one wafer head. Moreover, in a case in which the wafer head 7a is rotated around the X axis, between during suction and during imaging of the adjustment chip 11c, forward and backward in the X-direction of the wafer head 7a remain unchanged and are not interchanged, but forward and backward in the Y-direction are interchanged. Therefore, the control section 12 sets the head offset reference position by adding dXave to X and subtracting dYave from Y.

In step S27, the control section 12 sets Head=Head+1 in order to perform suction position adjustment of a next wafer head. In step S28, the control section 12 judges whether or not Head is greater than the number of a last head. In other words, the control section 12 judges whether or not suction position adjustment has been completed for the four wafer heads. Specifically, the control section 12 judges whether or not Head is greater than 4. If N is equal to or smaller than 4, the processing is returned to step S5. If N is equal to or greater than 5, the processing is proceeded to step S29. Moreover, the control section 12 performs suction position adjustment on the wafer head 7a using the head offset reference position, and performs suction position adjustment on the wafer heads 7b to 7d using head offset positions representing relative deviations from the head offset reference position.

In step S29, the control section 12 causes the negative pressure at the tip of the upthrust head 61 (the upthrust rod 61a) to be suspended. In step S30, the control section 12 lowers the upthrust head 61 (the upthrust rod 61a). Subsequently, the control of suction position adjustment is terminated.

As described above, in the present embodiment, imaging of the adjustment chip 11c being suctioned by the wafer heads 7a to 7d upon suction position adjustment is performed by the substrate recognition camera 41b. Based on results of the imaging, the control section 12 adjusts suction positions of the bare chip 11a by the wafer heads 7a to 7d. Specifically, misregistrations of the adjustment chip 11c when being suctioned by the wafer heads 7a to 7d can be recognized from the imaging performed by the substrate recognition camera 41b, and suction positions of the bare chip 11a by the wafer heads 7a to 7d can be accurately adjusted. Accordingly, the positional accuracy of suction of the bare chip 11a by the wafer heads 7a to 7d can be increased. In addition, even in a case in which a minute bare chip 11a is suctioned by the wafer heads 7a to 7d, since suction positions of the bare chip 11a by the wafer heads 7a to 7d can be accurately adjusted, a suction error can be suppressed.

Furthermore, in the present embodiment, imaging of the adjustment chip 11c being suctioned by the wafer heads 7a to 7d is performed by the substrate recognition camera 41b that performs imaging of the printed wiring board 20 on to which the bare chip 11a is to be mounted. In other words, the substrate recognition camera 41b that performs imaging on the printed wiring board 20 can be appropriated as a camera for performing imaging of the adjustment chip 11c being suctioned by the wafer heads 7a to 7d upon suction position adjustment. Therefore, the positional accuracy of suction of the bare chip 11a by the wafer heads 7a to 7d can be increased without having to separately provide a dedicated camera.

Moreover, in the present embodiment, for each of the four wafer heads 7a to 7d, the control section 12 causes the substrate recognition camera 41b to perform imaging of the adjustment chip 11c being suctioned by the wafer heads 7a to 7d. Based on results of the imaging, the suction positions of the bare chip 11a by the wafer heads 7a to 7d are adjusted. Consequently, in a construction including four wafer heads 7a to 7d, the positional accuracy of suction of the bare chip 11a by the respective wafer heads 7a to 7d can be increased. In addition, the positional accuracy of suction of the bare chip 11a by the respective wafer heads 7a to 7d can be increased when the bare chip 11a is handed over from the wafer heads 7a to 7d to the component mounting head 41a (41b) during substrate production. Therefore, bare chips 11a can easily be handed over from two wafer heads 7a and 7c to the two component mounting heads 41a at the same time.

Furthermore, the control section 12 adjusts suction positions of the bare chip 11a by the wafer heads 7a to 7d based on an average of results of imaging performed a plurality of times (for example, five times) by the substrate recognition camera 41b on the adjustment chip 11c being suctioned by the wafer heads 7a to 7d. Therefore, the accuracy of adjustment of suction positions of the wafer heads 7a to 7d can be further increased.

The control section 12 performs control to cause the wafer heads 7a to 7d to suction the bare chip 11a based on an adjustment result stored in the storage section 12e during substrate production. Consequently, without having to perform an adjustment each time the bare chip 11a is suctioned by the wafer heads 7a to 7d during substrate production, the bare chip 11a can be suctioned by the wafer heads 7a to 7d with high positional accuracy based on the adjustment result stored in the storage section 12e.

The component recognition camera 8 performs imaging of the adjustment chip 11c placed on the upthrust head 61 (the upthrust rod 61a). Based on a result of the imaging, the control section 12 causes the wafer heads 7a to 7d to suction the adjustment chip 11c and causes the substrate recognition camera 41b to perform imaging of the adjustment chip 11c being suctioned by the wafer heads 7a to 7d. Based on results of the imaging, the suction positions of the bare chip 11a by the wafer heads 7a to 7d are adjusted. Consequently, since a position of the adjustment chip 11c can easily be recognized by the component recognition camera 8, the adjustment chip 11c can easily be suctioned by the wafer heads 7a to 7d during suction position adjustment.

Moreover, in the present embodiment, imaging of the adjustment chip 11c being suctioned using the nozzle 7g fitted to the wafer heads 7a to 7d during substrate production is performed by the substrate recognition camera 41b. Based on results of the imaging, the suction positions of the bare chip 11a by the wafer heads 7a to 7d are adjusted. Therefore, since suction positions can be adjusted using the nozzle 7g that is used during actual substrate production, a suction position of the bare chip 11a can be adjusted more accurately.

The embodiment disclosed above is to be considered in all respects only as illustrative and not restrictive. Therefore, the scope of the present invention is limited not by the embodiment disclosed above but by the scope of the subjoined claims, and further embraces all modifications which are made within the meaning and range of equivalency of the claims.

For example, while an example in which suction position adjustment is performed using an adjustment chip placed on an upthrust section has been demonstrated in the embodiment above, the present invention is not limited thereto. In other embodiments, suction position adjustment may be performed using a wafer component at the time of substrate production which has been thrust up by the upthrust section. Consequently, a suction position of the wafer component at the time of substrate production by the extraction head can be adjusted more accurately.

Although an example in which the substrate recognition camera 41b is used as an imaging section when performing suction position adjustment has been demonstrated in the embodiment described above, the present invention is not limited thereto. In other embodiments, the substrate recognition camera 42b may be used as the imaging section, or a different existing camera may be appropriated as the imaging section. Alternatively, a dedicated camera for suction position adjustment may be provided.

While an example in which an adjustment chip is placed on the upthrust rod 61a when performing suction position adjustment has been demonstrated in the embodiment described above, the present invention is not limited thereto. In other embodiments, the adjustment chip may be placed on the upthrust rod 61b. Alternatively, suction position adjustment may be performed using a plurality of upthrust rods.

Although an example of a construction in which a wafer head (an extraction head) extracts a bare chip (a wafer component) and hands the bare chip over to a first head unit and a second head unit, and the first head unit and the second head unit mount the bare chip onto a printed wiring board (a substrate) has been demonstrated in the embodiment described above, the present invention is not limited thereto. In other embodiments, the extraction head may extract a wafer component and directly mount the wafer component onto a substrate. Alternatively, the extraction head may extract and hand over a wafer component to another device, and the other device may mount the wafer component onto a substrate.

In addition, while an example of a construction in which a wafer head is provided in a component transfer apparatus in the form of four extraction heads has been demonstrated in the embodiment described above, the present invention is not limited thereto. In other embodiments, a single extraction head may be provided in the component transfer apparatus, or extraction heads may be provided in plurality other than four in the component transfer apparatus.

Furthermore, although operations of processes by a control section have been described in the embodiment above with reference to a flow-driven flow chart in which processes are sequentially performed along a process flow for the sake of description, the present invention is not limited thereto. In other embodiments, operations of processes by the control section may be performed according to event-driven processing in which processes are executed in units of events. In this case, operations may be performed completely according to event-driven processing, or operations may be performed by combining event-driven processing and flow-driven processing.

The specific embodiment described above primarily includes an invention constructed as follows.

A component transfer apparatus according to an aspect of the present invention includes:

a wafer holding table capable of holding a wafer component;

an upthrust section that thrusts up the wafer component held by the wafer holding table from below;

an extraction head that suctions the wafer component thrust up by the upthrust section or an adjustment chip placed on the upthrust section;

an imaging section that performs imaging of the wafer component or the adjustment chip being suctioned by the extraction head; and a control section that controls driving of the extraction head and operations of the imaging section; wherein upon suction position adjustment, the control section causes the imaging section to perform imaging of the wafer component or the adjustment chip being suctioned by the extraction head, and adjusts a suction position of the wafer component by the extraction head based on a result of the imaging.

According to this component transfer apparatus, upon suction position adjustment, the control section causes the imaging section to perform imaging of the wafer component or the adjustment chip being suctioned by the extraction head and adjusts a suction position of the wafer component by the extraction head based on a result of the imaging. Consequently, since a misregistration of the wafer component or the adjustment chip being suctioned by the extraction head can be recognized from a result of the imaging by the imaging section, a suction position of the wafer component by the extraction head can be accurately adjusted. Therefore, a positional accuracy of suction of a wafer component by the extraction head can be increased. In addition, even in a case in which a minute wafer component is suctioned by the extraction head, since a suction position of the wafer component by the extraction head can be accurately adjusted, a suction error can be suppressed. Furthermore, by performing suction position adjustment using a wafer component having a same shape as that used during substrate production, a suction position of the wafer component by the extraction head during substrate production can be adjusted more accurately.

In the component transfer apparatus described above, favorably, a substrate recognition camera that performs imaging of a substrate mounted with a wafer component is used as the imaging section. Such a construction enables the substrate recognition camera that performs imaging of a substrate to be appropriated as the imaging section that performs imaging of the wafer component or the adjustment chip being suctioned by the extraction head during suction position adjustment. Therefore, the positional accuracy of suction of a wafer component by the extraction head can be increased without having to separately provide a dedicated imaging section.

In the component transfer apparatus described above, desirably, the extraction head is provided in plurality, and for each of the plurality of extraction heads, the control section causes the imaging section to perform imaging of the wafer component or the adjustment chip being suctioned by the extraction head, and adjusts a suction position of the wafer component by the extraction head based on a result of the imaging. According to this construction, even when a plurality of extraction heads are provided, a positional accuracy of suction of a wafer component by each extraction head can be increased. In addition, when handing over a wafer component from the extraction heads to a mounting head during substrate production, the positional accuracy of suction of the wafer component by each extraction head can be increased. Therefore, wafer components can easily be handed over from a plurality of extraction heads to a plurality of mounting heads at the same time.

In the component transfer apparatus described above, desirably, the control section adjusts a suction position of a wafer component by the extraction head based on an average of results of imaging performed a plurality of times by the imaging section on the wafer component or an adjustment chip being suctioned by the extraction head. According to this construction, an accuracy of adjustment of a suction position of the extraction head can be further increased.

In the component transfer apparatus described above, desirably, a storage section that stores results of adjustment of a suction position of the wafer component by the extraction head is further provided, and the control section performs control to cause the extraction head to suction the wafer component during substrate production based on the adjustment result stored in the storage section. According to this construction, without having to perform an adjustment each time a wafer component is suctioned by the extraction head during substrate production, the wafer component can be suctioned by the extraction head with high positional accuracy based on the adjustment result stored in the storage section.

In the component transfer apparatus described above, desirably, a component recognition camera that performs imaging of the wafer component thrust up by the upthrust section or the adjustment chip placed on the upthrust section is further provided, wherein the control section causes the extraction head to suction the wafer component thrust up by the upthrust section or the adjustment chip placed on the upthrust section based on a result of the imaging of the wafer component or the adjustment chip performed by the component recognition camera, and causes the imaging section to perform imaging of the wafer component or the adjustment chip being suctioned by the extraction head and adjusts a suction position of the wafer component by the extraction head based on a result of the imaging. According to this construction, since a position of the wafer component or the adjustment chip can be readily recognized by the component recognition camera, the wafer component or the adjustment chip can easily be suctioned by the extraction head upon suction position adjustment.

In a case in which a result of the imaging of the adjustment chip placed on the upthrust section is used, desirably, a placement reference position of the adjustment chip on the upthrust section is determined in advance, and the control section acquires a deviation of the adjustment chip placed on the upthrust section from the placement reference position from a result of the imaging of the adjustment chip performed by the component recognition camera, and drives the extraction head in accordance with the deviation to cause the extraction head to suction the adjustment chip, and acquires a deviation between the center of the extraction head and the center of the adjustment chip from a result of the imaging of the adjustment chip performed by the imaging section. According to this construction, the deviation can be used as a parameter for suction position adjustment.

In the component transfer apparatus described above, desirably, a nozzle that is used to suction a wafer component during substrate production is fitted to the extraction head, and the control section causes the imaging section to perform imaging of the wafer component or the adjustment chip being suctioned using the nozzle fitted to the extraction head during substrate production, and adjusts a suction position of the wafer component by the extraction head based on a result of the imaging. According to this construction, since a suction position can be adjusted using the nozzle that is used during actual substrate production, a suction position of a wafer component can be adjusted more accurately.

A suction position adjustment method according to another aspect of the present invention is a suction position adjustment method for a component transfer apparatus including an upthrust section, an extraction head, and an imaging section, the suction position adjustment method including:

causing the extraction head to suction the wafer component thrust up by the upthrust section or an adjustment chip placed on the upthrust section;

causing the imaging section to perform imaging of the wafer component or the adjustment chip being suctioned by the extraction head; and adjusting a suction position of the wafer component by the extraction head based on a result of the imaging.

According to this adjustment method, imaging of the wafer component or the adjustment chip being suctioned by the extraction head is performed by the imaging section, and a suction position of the wafer component by the extraction head is adjusted based on a result of the imaging. Consequently, a misregistration of the wafer component or the adjustment chip being suctioned by the extraction head can be recognized from a result of the imaging performed by the imaging section. Therefore, a suction position of a wafer component by the extraction head can be accurately adjusted. As a result, a positional accuracy of suction of a wafer component by the extraction head can be increased. In addition, even in a case in which a minute wafer component is suctioned by the extraction head, since a suction position of the wafer component by the extraction head can be accurately adjusted, a suction error can be suppressed. Furthermore, by performing suction position adjustment using a wafer component having a same shape as that used during substrate production, a suction position of the wafer component by the extraction head during substrate production can be adjusted more accurately.

As heretofore described, according to the present invention, the positional accuracy of suction of a wafer component by an extraction head can be increased.

This application is based on Japanese Patent application No. 2011-250001 filed in Japan Patent Office on Nov. 15, 2011, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A component transfer apparatus capable of extracting a bare chip from a diced wafer and mounting the bare chip onto a board, comprising:

a wafer holder including a wafer sheet that the diced wafer is pasted on and holding the diced wafer via the wafer sheet;

an upthrust section that includes an upthrust rod separating the bare chip of the wafer from the wafer sheet at a predetermined component extraction work position and thrusting up the bare chip of the wafer held by the wafer holder from below;

an extraction head that suctions the bare chip thrust up by the upthrust rod or an adjustment chip placed on the upthrust rod at the component extraction work position and moves the suctioned bare chip or the adjustment chip to a predetermined handover position above the component extraction work position, the handover position being a position at which the extraction head hands over the bare chip or the adjustment chip to a component mounting head that suctions the bare chip being suctioned by the extraction head at the handover position;

a frame member that supports the extraction head, the extraction head being rotatably supported around an axis in a lateral direction by the frame member so as to be capable of rising and falling;

a substrate recognition camera that performs imaging of the board on which the bare chip is mounted at a predetermined imaging position;

a head unit on which the component mounting head and the substrate recognition camera are mounted;

a driving portion that moves the substrate recognition camera between the imaging position and the handover position with moving of the head unit; and a control section that controls driving of the extraction head, operations of the substrate recognition camera and operations of the driving portion; wherein upon suction position adjustment, the control section causes the substrate recognition camera to move from the imaging position to the handover position, the extraction head to rotate so that a tip of the extraction head faces downward and to lower to the component extraction work position, the extraction head to suction the bare chip thrust up by the upthrust rod or the adjustment chip placed on the upthrust rod at the component extraction work position, the extraction head to move the suctioned bare chip or the adjustment chip to the handover position by rotating the extraction head so that the tip of the extraction head faces upward and lifting the extraction head, and the substrate recognition camera to perform imaging of the bare chip being suctioned by the extraction head at the handover position or the adjustment chip being suctioned by the extraction head at the handover position, and adjusts a suction position of the bare chip by the extraction head based on a result of the imaging.

2. The component transfer apparatus according to claim 1, wherein the extraction head is provided in plurality, and for each of the plurality of extraction heads, the control section causes the substrate recognition camera to perform imaging of the bare chip or the adjustment chip being suctioned by the extraction head, and adjusts a suction position of the bare chip by the extraction head based on a result of the imaging.

3. The component transfer apparatus according to claim 1, wherein the control section adjusts a suction position of the bare chip by the extraction head based on an average of results of imaging performed a plurality of times by the substrate recognition camera on the bare chip or the adjustment chip being suctioned by the extraction head.

4. The component transfer apparatus according to claim 1, further comprising:

a storage section that stores a result of adjustment of a suction position of the bare chip by the extraction head; wherein the control section performs control to cause the extraction head to suction the bare chip during substrate production based on the adjustment result stored in the storage section.

5. The component transfer apparatus according to claim 1, further comprising:
a component recognition camera that performs imaging of the bare chip thrust up by the upthrust rod or the adjustment chip placed on the upthrust rod; wherein the control section:
causes the extraction head to suction the bare chip thrust up by the upthrust rod or the adjustment chip placed on the upthrust rod based on a result of the imaging of the bare chip or the adjustment chip performed by the component recognition camera; and
causes the substrate recognition camera to perform imaging of the bare chip or the adjustment chip being suctioned by the extraction head and adjusts a suction position of the bare chip by the extraction head based on a result of the imaging.

6. The component transfer apparatus according to claim 5, wherein
in a case in which a result of the imaging of the adjustment chip placed on the upthrust rod is used,
a placement reference position of the adjustment chip on the upthrust rod is determined in advance, and
the control section:
acquires a deviation of the adjustment chip placed on the upthrust rod from the placement reference position from a result of the imaging of the adjustment chip by the component recognition camera, and drives the extraction head in accordance with the deviation to cause the extraction head to suction the adjustment chip; and
acquires a deviation between the center of the extraction head and the center of the adjustment chip from a result of the imaging of the adjustment chip by the substrate recognition camera.

7. The component transfer apparatus according to claim 1, wherein
a nozzle that is used to suction the bare chip during substrate production is fitted to the extraction head, and
the control section causes the substrate recognition camera to perform imaging of the bare chip or the adjustment chip being suctioned using the nozzle fitted to the extraction head during substrate production, and adjusts a suction position of the bare chip by the extraction head based on a result of the imaging.

8. A suction position adjustment method for a component transfer apparatus comprising an upthrust rod, an extraction head, a component mounting head, a substrate recognition camera, a head unit on which the component mounting head and the substrate recognition camera are mounted and a driving portion, the component mounting head suctioning the bare chip being suctioned by the extraction head at a predetermined handover position, the substrate recognition camera performing imaging of the board on which the bare chip is mounted at a predetermined imaging position, and the suction position adjustment method comprising:
causing the substrate recognition camera to move from the imaging position to the handover position with moving of the head unit;
causing the extraction head to rotate so that a tip of the extraction head faces downward and to lower to the component extraction work position;
causing the extraction head to suction the bare chip thrust up by the upthrust rod or an adjustment chip placed on the upthrust rod at a predetermined component extraction work position,
causing the extraction head to move the suctioned bare chip or the adjustment chip to a predetermined handover position above the component extraction work position by rotating the extraction head so that the tip of the extraction head faces upward and lifting the extraction head, the handover position being a position at which the extraction head hands over the bare chip or the adjustment chip to the component mounting head;
causing the substrate recognition camera to perform imaging of the bare chip being suctioned by the extraction head at the handover position or the adjustment chip being suctioned by the extraction head at the handover position; and
adjusting a suction position of the bare chip by the extraction head based on a result of the imaging.

9. A component transfer apparatus capable of extracting a bare chip from a diced wafer and mounting the bare chip onto a board, comprising:
a wafer holder including a wafer sheet that the diced wafer is pasted on and holding the diced wafer via the wafer sheet;
an upthrust section that includes an upthrust rod separating the bare chip of the wafer from the wafer sheet at a predetermined component extraction work position and thrusting up the bare chip of the wafer held by the wafer holder from below;
an extraction head that suctions the bare chip thrust up by the upthrust rod at the component extraction work position and moves the suctioned bare chip to a predetermined handover position above the component extraction work position, the handover position being a position at which the extraction head hands over the bare chip or the adjustment chip to a component mounting head that suctions the bare chip being suctioned by the extraction head at the handover position;
a frame member that supports the extraction head, the extraction head being rotatably supported around an axis in a lateral direction by the frame member so as to be capable of rising and falling;
a substrate recognition camera that performs imaging of the board on which the bare chip is mounted at a predetermined imaging position;
a head unit on which the component mounting head and the substrate recognition camera are mounted;
a component recognition camera that performs imaging of the bare chip to be extracted before the bare chip is extracted from the wafer,
a driving portion that moves the substrate recognition camera and the component recognition camera, the substrate recognition camera being moved between the imaging position and the handover position with moving of the head unit; and
a control section that controls driving of the extraction head, operations of the substrate recognition camera and the component recognition camera, and operations of the driving portion; wherein
upon suction position adjustment, the control section causes
the upthrust rod to move to a placement reference position where an adjustment chip for calibration is placed,
the component recognition camera to move to the placement reference position to image the adjustment chip placed on the upthrust rod by the component recognition camera and to acquire a deviation of the adjustment chip from the placement reference position from a result of the imaging of the adjustment chip,
the substrate recognition camera to move from the imaging position to the handover position, the extraction head to rotate so that a tip of the extraction head faces downward and to lower to the component extraction work position, the extraction head to move in accordance with the deviation, and to suction the adjustment chip placed on the upthrust rod, the extraction head sucking the adjustment chip to move to the handover position by rotating the extraction head so that the tip of the extraction head faces upward and lifting the extraction head, the substrate recognition camera to perform imaging of the adjustment chip being suctioned by the extraction head at the handover position, and adjusts a suction position of the bare chip by the extraction head based on a result of the imaging, and then the extraction head sucking the adjustment chip to move to the placement reference position to place the adjustment chip on the upthrust rod.

* * * * *